United States Patent
Kurokawa et al.

(10) Patent No.: US 8,487,648 B2
(45) Date of Patent: Jul. 16, 2013

(54) SEMICONDUCTOR INTEGRATED CIRCUIT

(75) Inventors: Masashi Kurokawa, Kanagawa (JP);
Kenichi Kawakami, Kanagawa (JP)

(73) Assignee: Renesas Electronics Corporation,
Kawasaki-shi, Kanagawa (JP)

( * ) Notice: Subject to any disclaimer, the term of this patent is extended or adjusted under 35 U.S.C. 154(b) by 85 days.

(21) Appl. No.: 13/067,645

(22) Filed: Jun. 16, 2011

(65) Prior Publication Data

US 2011/0248741 A1    Oct. 13, 2011

Related U.S. Application Data

(62) Division of application No. 12/382,727, filed on Mar. 23, 2009, now Pat. No. 7,982,490.

(30) Foreign Application Priority Data

Mar. 24, 2008 (JP) ................................. 2008-075254

(51) Int. Cl.
*H03K 17/16* (2006.01)
(52) U.S. Cl.
USPC ............................................. 326/27; 327/310
(58) Field of Classification Search
USPC ...................... 326/26–27; 327/306, 309–310
See application file for complete search history.

(56) References Cited

U.S. PATENT DOCUMENTS

| 5,406,149 | A  | * | 4/1995 | An et al. ........................ 327/311 |
| 5,917,361 | A  | * | 6/1999 | Wong et al. ................... 327/391 |
| 6,191,647 | B1 |   | 2/2001 | Tanaka et al. |
| 7,886,259 | B2 |   | 2/2011 | Rius Vazquez et al. |
| 2010/0238336 | A1 | * | 9/2010 | Okamoto et al. ............. 348/308 |
| 2010/0259430 | A1 | * | 10/2010 | Okamoto et al. ............. 341/122 |

FOREIGN PATENT DOCUMENTS

JP    10-126237    5/1998

* cited by examiner

*Primary Examiner* — Jason M Crawford
(74) *Attorney, Agent, or Firm* — McGinn IP Law Group, PLLC (57) ABSTRACT

A semiconductor integrated circuit includes a macro connected between a first power supply line and a second power supply line to drive a load, and a power-supply-noise cancelling circuit connected between an input and an output of the macro to generate a current for canceling one of a current flowing from the first power supply line to the output of the macro and a current flowing from the output of the macro to the second power supply line, on the basis of a potential difference between the input and the output of the macro. The macro and the power-supply-noise cancelling circuit are mounted in a same chip.

23 Claims, 9 Drawing Sheets

SEMICONDUCTOR INTEGRATED CIRCUIT

REFERENCE TO RELATED APPLICATION

The present Application is a Divisional Application of U.S. patent application Ser. No. 12/382,727 filed on Mar. 23, 2009, now U.S. Pat. No. 7,982,490 which is based on Japanese Patent Application No. 2008-075254, filed on Mar. 24, 2008, the entire content of which is incorporated herein by reference.

BACKGROUND OF THE INVENTION

1. Field of the Invention

The present invention relates to a semiconductor integrated circuit, and more particularly, to a semiconductor integrated circuit including a noise cancelling circuit.

2. Description of Related Art

In recent years, the technology of semiconductor integrated circuit (hereinafter, referred to as "LSI") has achieved a rapid development for high operating speed and high packing density (high integration). A power supply voltage has been increasingly reduced in order to achieve the high operating speed, with the result that an effect of noise, which is superimposed on an internal power supply, on characteristics such as jitter has been increased. In view of this, there is a demand for a reduction in power supply noise generated in an LSI.

Figure 9:
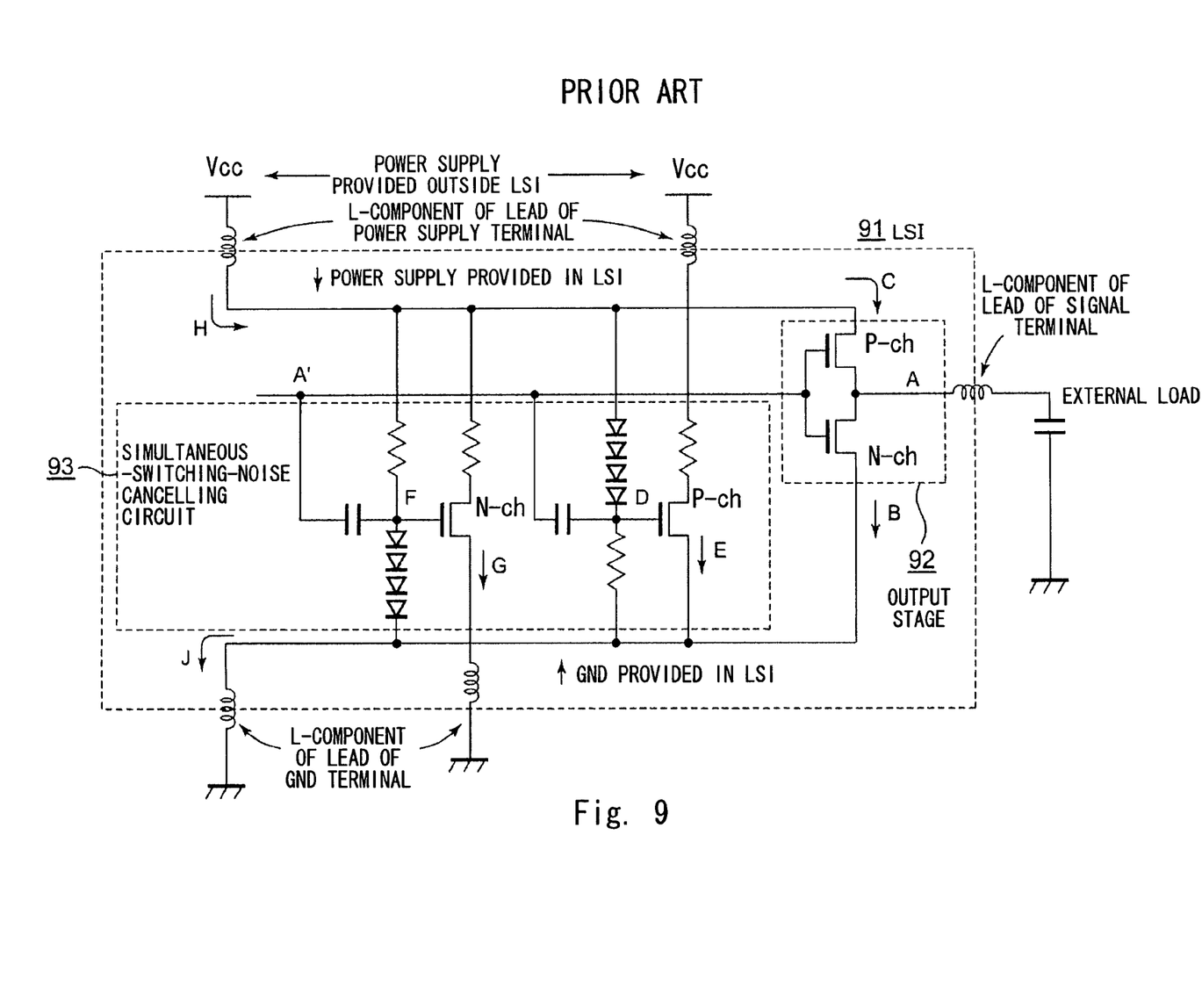
FIG. 9 is a circuit diagram showing a noise cancelling circuit according to the prior art.

To reduce the power supply noise, a noise cancelling circuit as disclosed in Japanese Unexamined Patent Application Publication No. 10-126237 has been proposed. As shown in FIG. 9, the noise cancelling circuit according to the prior art includes a simultaneous-switching-noise cancelling circuit 93 to cancel switching noise generated by an output stage 92 including a P-channel transistor and an N-channel transistor which are connected between a power supply and a GND.

The simultaneous-switching-noise cancelling circuit 93 includes a GND-side simultaneous-switching-noise cancelling circuit, which is provided so as to cancel the GND-side simultaneous switching noise, and a VCC-side simultaneous-switching-noise cancelling circuit, which is provided so as to cancel the VCC-side simultaneous switching noise.

The GND-side simultaneous-switching-noise cancelling circuit includes: a P-channel transistor having a gate connected to a node D; a diode provided between the power supply provided in the LSI and the node D; a capacitor provided between an input terminal A' and the node D; and a resistor element provided between the node D and the GND provided in the LSI. Likewise, the VCC-side simultaneous-switching-noise cancelling circuit includes: an N-channel transistor having a gate connected to a node F; a resistor element connected between the power supply provided in the LSI and the node D; a capacitor provided between the input terminal A' and the node D; and a diode provided between the node F and the GND provided in the LSI.

Operations of the simultaneous-switching-noise cancelling circuit 93 configured as described above will be described with reference to FIG. 10.

Figure 10:
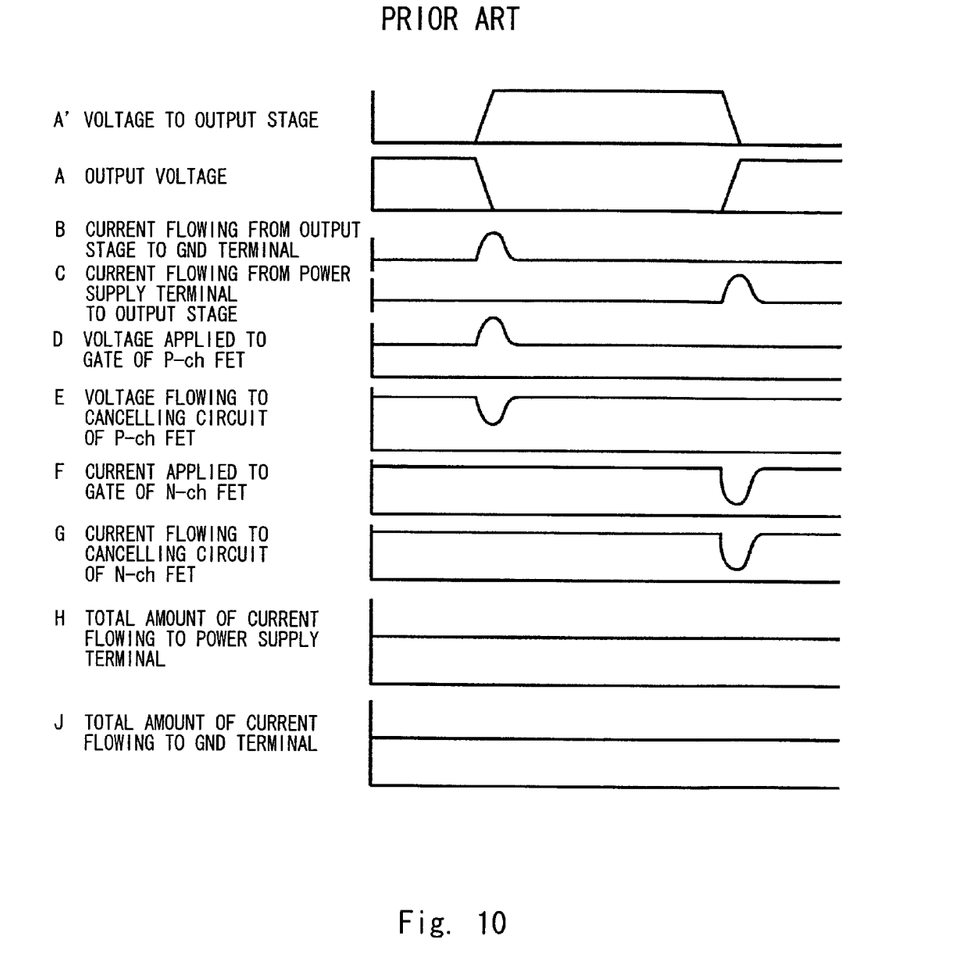
FIG. 10 is a waveform chart showing voltage and current waveforms illustrating operations of the noise cancelling circuit according to the prior art.

First, signals shown in FIG. 10 are described. A signal "A'" corresponds to a voltage of an input signal input to the output stage 92, and is input to each of a gate of the P-channel transistor and a gate of the N-channel transistor, which constitute the output stage 92, as a voltage changing from "L" to "H" or a voltage changing from "H" to "L". A signal "A" corresponds to a voltage output from the output stage 92 to a signal terminal in accordance with an input voltage of the input signal "A'". A signal "B" corresponds to a current flowing from the output stage to a GND terminal, and also corresponds to a current caused to flow due to an L-component of a lead of the GND terminal. A signal "C" corresponds to a current flowing from a power supply terminal to the output stage. A signal "D" corresponds to a voltage at the node D, that is, a voltage applied to the gate of the P-ch FET forming the circuit that cancels the simultaneous switching noise generated due to the L-component of the lead of the GND terminal. A signal "E" corresponds to a current flowing to the noise cancelling circuit of the P-ch FET, that is, a current caused to flow when the signal "D" is applied to the gate. A signal "F" corresponds to a voltage at the node F, that is, a voltage applied to the gate of the N-ch FET forming the circuit that cancels the simultaneous switching noise generated due to the L-component of the lead of the GND terminal. A signal "G" corresponds to a current flowing to the noise cancelling circuit of the N-ch FET, that is, a current caused to flow when the signal "F" is applied to the gate. A signal "H" corresponds to a total amount of current flowing to the power supply terminal, that is, a current represented as H=C+G, which is adjusted to become "0" in this case. A signal "J" corresponds to a total amount of current flowing to the GND terminal, that is, a current represented as J=B+E, which is adjusted to become "0" in this case.

As described above, when each power supply terminal and each GND terminal are provided to the simultaneous-switching-noise cancelling circuit, the following effects can be obtained. (1) When the signal "A'" is changed from "H" to "L" and when the output voltage from the output stage 92 is changed from "L" to "H", the simultaneous switching noise generated due to the lead component of the power supply terminal can be cancelled, and when a cancel current is caused to flow to the power supply terminal, the interference caused on the GND terminal side due to the cancel current is eliminated, which contributes to a stable operation. (2) When the signal "A'" is changed from "L" to "H" and when the output voltage from the output stage 92 is changed from "H" to "L", the simultaneous switching noise generated due to the lead component of the GND terminal can be cancelled, and when the cancel current is caused to flow to the GND terminal, the interference caused on the power supply terminal side due to the cancel current is eliminated, which contributes to a stable operation.

As described above, the power-supply-noise cancelling circuit according to the prior art determines the operation of the simultaneous-switching-noise cancelling circuit 93, that is, determines a timing at which the noise cancellation is carried out, in accordance with the change of the input signal input to the output stage 92. As a result, even when an external load connected to the output of the output stage 92 is varied, the timing for the current to cancel the noise is not changed.

Accordingly, when the external load is varied in the power-supply-noise cancelling circuit according to the prior art, the output voltage "A", the current "B" flowing from the output stage to the GND terminal, and the current "C" flowing from the power supply terminal to the output stage are varied depending on the magnitude of the external load. Meanwhile, the current "E" flowing to the P-channel transistor of the GND-side simultaneous-switching-noise cancelling circuit, and the current "G" flowing to the N-channel transistor of the VCC-side simultaneous-switching-noise cancelling circuit are not varied irrespective of the magnitude of the external load. Accordingly, when the load is large, B>E and C>G are satisfied. Further, when the load is small, B<E and C<G are satisfied.

As a result, the total amount "H" of currents flowing to the power supply terminal and the total amount "J" of currents flowing to the GND terminal are not enough to absorb the fluctuation of the load, which causes a problem in that the current cancellation cannot be satisfactorily carried out.

SUMMARY

A first exemplary aspect of an embodiment of the present invention is a semiconductor integrated circuit including: an output circuit connected between a first power supply line and a second power supply line, having an input connected to an input terminal, and having an output connected to an output terminal; and a power-supply-noise cancelling circuit connected between the input terminal and the output terminal to generate a current for canceling one of a current flowing from the first power supply line to the output terminal and a current flowing from the output terminal to the second power supply line, on the basis of a potential difference between the input terminal and the output terminal.

A period for cancellation is determined based on the potential difference between the input signal and the output signal. Accordingly, even when the external load connected to the output terminal is varied, the period for cancellation corresponding to a variation in current value due to the variation of the external load can be determined. As a result, the noise cancellation can be effectively performed.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION OF THE EXEMPLARY EMBODIMENTS

The invention will now be described herein with reference to illustrative embodiments. Those skilled in the art will recognize that many alternative embodiments can be accomplished using the teachings of the present invention and that the invention is not limited to the embodiments illustrated for explanatory purposes.

A semiconductor integrated circuit including a noise cancelling circuit according to an exemplary embodiment of the present invention includes: an output circuit 1 connected between a first power supply line (an internal power supply) VDD0 and a second power supply line (an internal ground) GND0, having an input terminal connected to an input terminal T1, and having an output terminal connected to an output terminal T2; and a power-supply-noise cancelling circuit 2 connected between the input terminal T1 and the output terminal T2, and configured so as to generate a current to cancel a current flowing from the first power supply line VDD0 to the output terminal T2 or a current flowing from the output terminal T2 to the second power supply line GND0 on the basis of a potential difference between the input terminal and the output terminal. The power-supply-noise cancelling circuit 2 having the above-mentioned configuration is provided so that an operation timing of the power-supply-noise cancelling circuit 2 can be determined on the basis of the potential difference between the input terminal T1 and the output terminal T2. Accordingly, the operation timing is determined according to the current flowing between the output terminal T2 and the input terminal T1 even when an external load connected to the output terminal T2 is varied, which makes it possible to dynamically change the timing of the noise cancellation.

Figure 1:
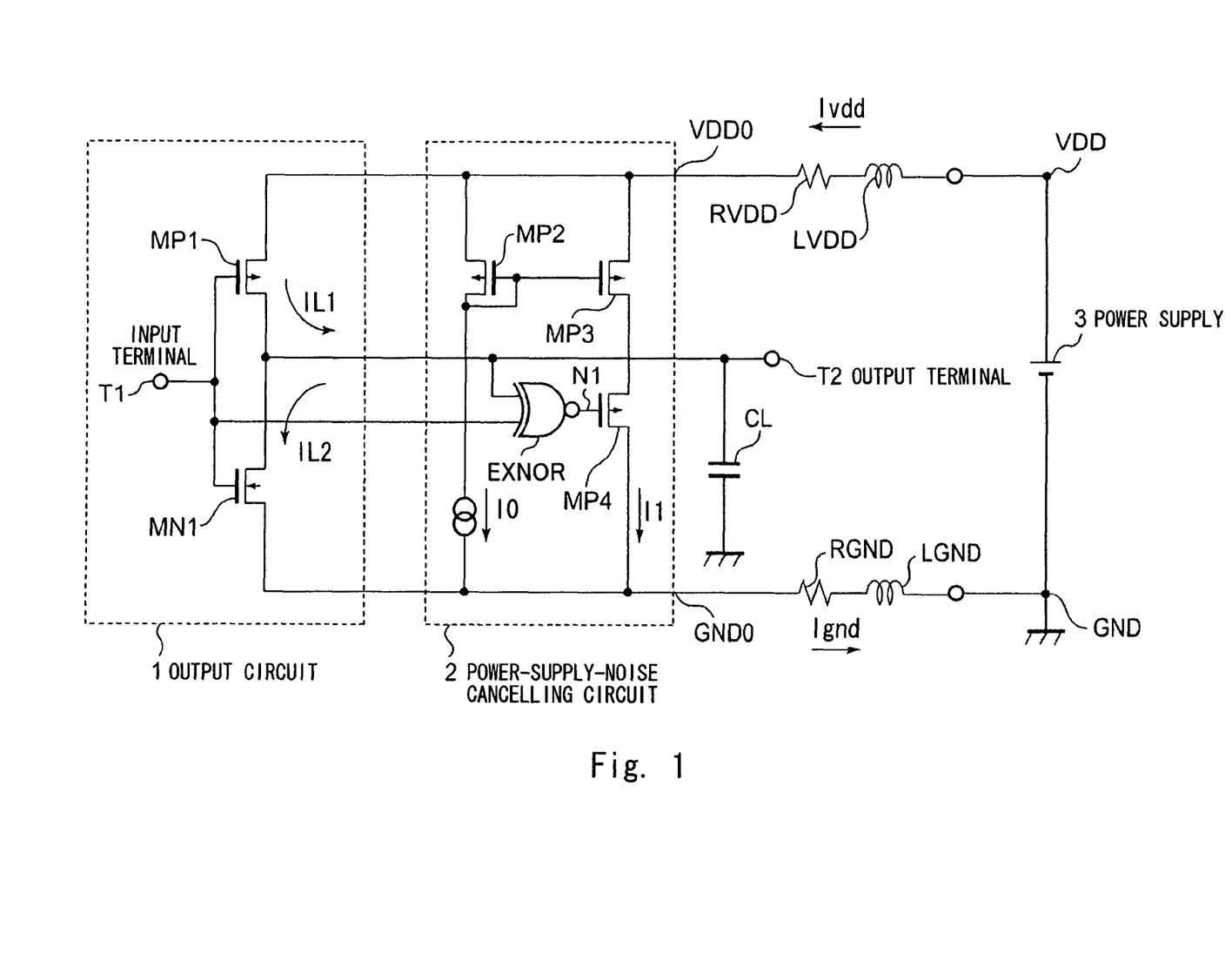
FIG. 1 is a circuit diagram including a power-supply-noise cancelling circuit according to a first exemplary embodiment of the present invention.

The semiconductor integrated circuit including the power-supply-noise cancelling circuit according to an exemplary embodiment of the present invention will be described in detail with reference to FIG. 1.

The semiconductor integrated circuit according to a first exemplary embodiment of the present invention includes the output circuit 1 and the power-supply-noise cancelling circuit 2. The output circuit 1 includes a P-channel transistor MP1 and an N-channel transistor MN1. The P-channel transistor MP1 is connected between the internal power supply VDD0 and the output terminal T2 and has a gate connected to the input terminal T1. The N-channel transistor MN1 is connected between the output terminal T2 and the internal ground GND0, and has a gate connected to the input terminal T1. The power-supply-noise cancelling circuit 2 includes a current mirror circuit, a current source I0, a P-channel transistor MP4, and a gate circuit EXNOR. The current mirror circuit includes P-channel transistors MP2 and MP3 each connected to the internal power supply VDD0. The P-channel transistor MP2 serves as an input of the current mirror circuit, and the P-channel transistor MP3 serves as an output of the current mirror circuit. The current source 10 is connected between the input of the current mirror circuit and the internal ground GND0. The P-channel transistor MP4 is connected between the output of the current mirror circuit and the internal ground GND0. The gate circuit EXNOR receives its two inputs from the input terminal and the output terminal of the output circuit 1, and outputs an exclusive NOR between the two inputs to a gate of the P-channel transistor MP4.

Specifically, the input terminal T1 is connected to each of the gate of the transistor MP1 and the gate of the transistor MN1. A drain of the transistor MP1 and a drain of the transistor MN1 are each connected to the output terminal T2. A source of the transistor MP1 is connected to the internal power supply VDD0 provided in the LSI. A source of the transistor MN1 is connected to the internal ground GND0 provided in the LSI. Further, the input terminal T1 and the output terminal T2 are connected to the two inputs of the gate circuit EXNOR, and the output of the gate circuit EXNOR is connected to the gate of the transistor MP4. A source of the transistor MP4 is connected to a drain of the transistor MP3. A drain of the transistor MP4 is connected to the internal ground GND0 provided in the LSI. The transistor MP4 becomes ON state when the output of the gate circuit EXNOR is low, that is, when the potential at the input terminal T1 is equal to the potential at the output terminal T2. When the potentials are different from each other (during a transition period), the transistor MP4 becomes OFF state. A gate of the transistor MP2, a drain of the transistor MP2, and a gate of the transistor MP3 are connected to each other, thereby forming a current mirror. Further, the current source I0 is inserted between the drain of the transistor MP2 and the internal ground GND0 provided in the LSI. A source of the transistor MP2 and a source of transistor MP3 are each connected to the internal power supply VDD0 provided in the LSI.

The internal power supply VDD0 provided in the LSI is connected to an external power supply VDD through a resistor RVDD and an inductor LVDD. The internal ground GND0 provided in the LSI is connected to an external ground GND through a resistor RGND and an inductor LGND. The output terminal T2 is connected to a load capacitance CL.

Next, operations of the power-supply-noise cancelling circuit 2 according to the first exemplary embodiment will be described with reference to FIG. 2.

Figure 2:
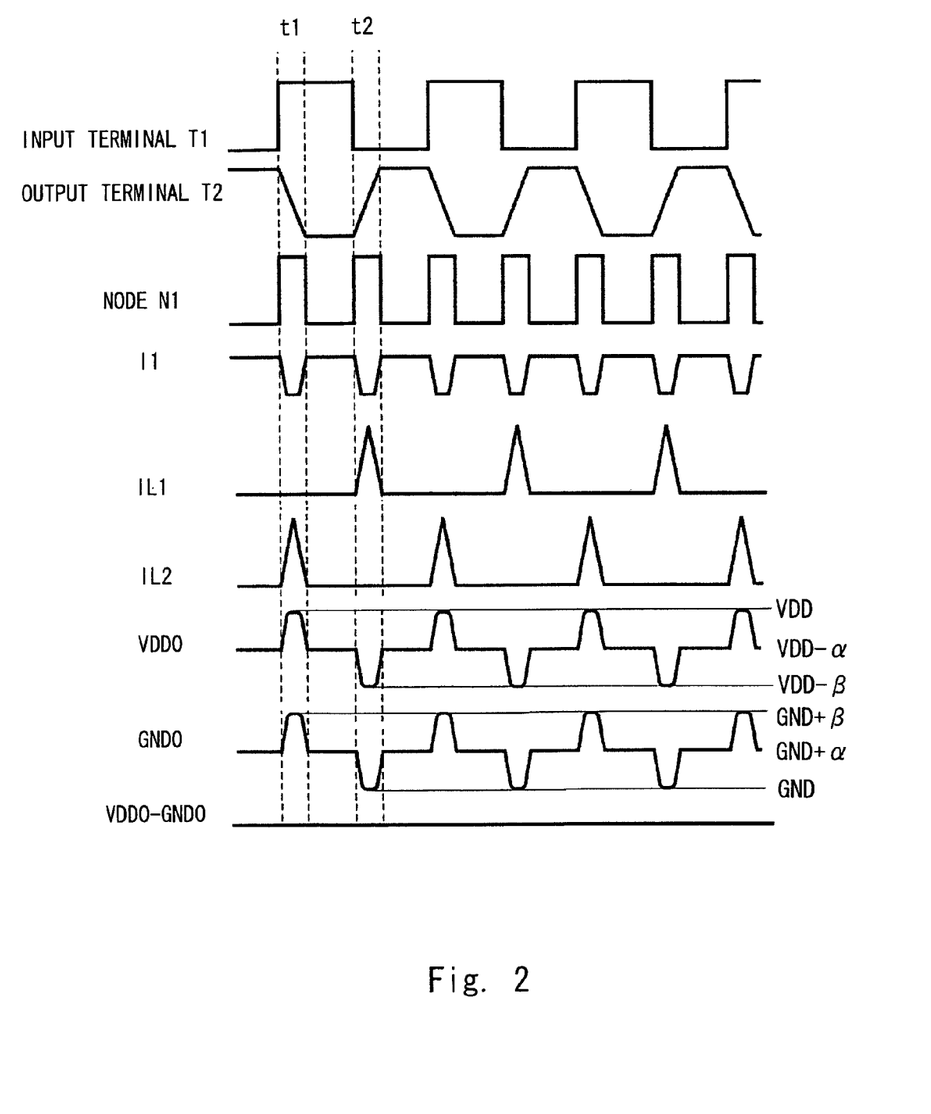
FIG. 2 is a waveform chart showing voltage and current waveforms at nodes of the power-supply-noise cancelling circuit according to the first exemplary embodiment.

Referring to FIG. 2, when a signal that changes from a low level to a high level is input from the input terminal T1 during a period t1, the output circuit 1 causes a discharge current IL2 to flow from the output terminal T2 to the internal power supply GND0 so as to output a signal (low-level signal) obtained by inverting the input signal, from the output terminal T2. The potential of the internal ground GND0 increases from GND+α to GND+β due to the flow of the discharge current IL2 from the internal ground GND0. Note that α represents an amount of rise in the potential of the internal ground GND0 occurring when a constant current I1 flows, and β represents an amount of rise in the potential of the internal ground GND0 occurring when the discharge current IL2 flows. In this case, since the discharge current IL2 flows from the load capacitance CL connected to the output terminal T2, the gate circuit EXNOR obtains an exclusive NOR between the potential at the input terminal T1 and the potential at the output terminal T2, and outputs the result to a node N1. Since the gate circuit EXNOR sets the node N1 to the high level during the period in which the discharge current IL2 flows from the load capacitance CL, the transistor MP4 is turned off, and the constant current I1 caused to flow through the power-supply-noise cancelling circuit by the current source I0 and the transistors MP2 and MP3, which constitute the current mirror, is turned off. As a result, the constant current I1 does not flow to the internal ground GND0, and thus an amount of current provided by the internal power supply VDD0 is supplied to the internal ground GND0. When the amount of current flowing from the internal power supply VDD0 is reduced, the amount β of current corresponding to the reduced amount of current is supplied to the internal ground GND0. Thus, power supply noise generated by the discharge current IL2 flowing from the load capacitance CL can be cancelled, and a fluctuation in potential of the internal ground GND0 provided in the LSI can be suppressed.

Further, when a signal that changes from the high level to the low level is input to the input terminal T1 during a period t2 shown in FIG. 2, the output circuit 1 supplies a charging current IL1 to the output terminal T2 so as to output an inverted signal (high-level signal) to the output terminal T2. The potential of the internal power supply VDD0 decreases from VDD-α to VDD-β due to the flow of the charging current IL1 from the internal power supply VDD0. Note that α represents an amount of drop in the potential of the internal power supply VDD0 occurring when the constant current I1 flows, and β represents an amount of drop in the potential of the internal power supply VDD0 occurring when the charging current IL1 flows. In this case, the charging current IL1 flows from the internal power supply VDD0 to the load capacitance CL, which is connected to the output terminal T2, through the P-channel transistor MP1 of the output circuit 1. In the power-supply-noise cancelling circuit 2, the gate circuit EXNOR obtains an exclusive NOR between the potential at the input terminal T1 and the potential at the output terminal T2, and outputs the result to the node N1. Since the gate circuit EXNOR sets the node N1 to the high level during the period in which the charging current IL1 flows to the load capacitance CL, the transistor MP4 is turned off, and the constant current I1 caused to flow through the power-supply-noise cancelling circuit 2 by the current source I0 and the transistors MP2 and MP3, which constitute the current mirror, is turned off. As a result, the constant current I1 does not flow from the internal power supply VDD0, and thus an amount of current flowing to the internal ground GND0 of FIG. 2 is reduced. When the amount of current flowing to the internal ground GND0 is reduced, the amount β of current corresponding to the reduced amount of current is supplied to the internal power supply VDD0. Thus, power supply noise generated by the charging current IL1 flowing to the load capacitance CL can be cancelled, and a fluctuation in potential of the internal power supply VDD0 provided in the LSI can be suppressed.

As apparent from the difference between the internal power supply VDD0 and the internal ground GND0 as shown in FIG. 2, when the power-supply-noise cancelling circuit 2 is provided, the difference can be held at a constant potential, which makes it possible to cancel the power supply noise.

Figure 3:
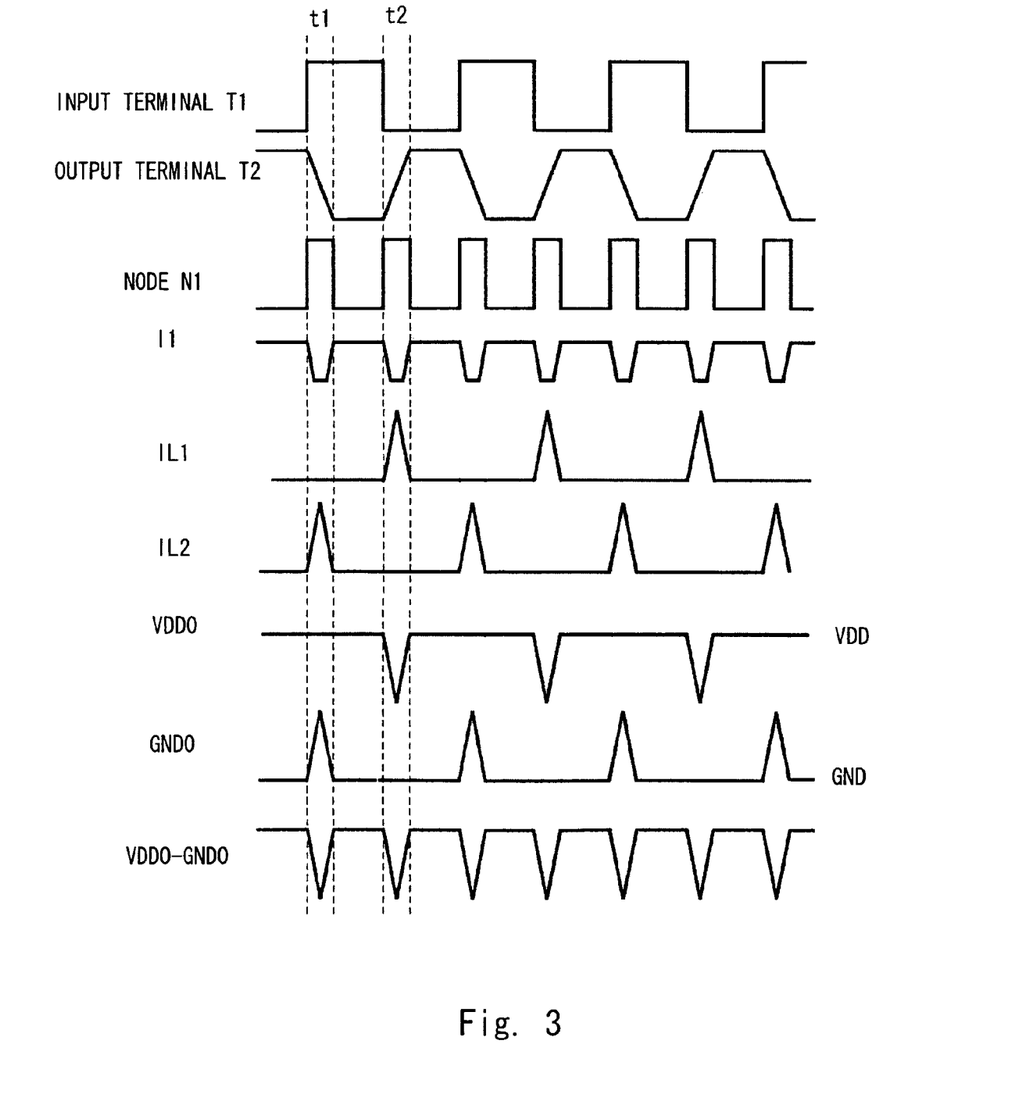
FIG. 3 is a waveform chart showing voltage and current waveforms at nodes when the power-supply-noise cancelling circuit according to the first exemplary embodiment is not employed.

In comparison with the above exemplary embodiment, FIG. 3 illustrates the internal power supply VDD0, the internal ground GND0, and a difference therebetween in the case where the power-supply-noise cancelling circuit is not provided. As shown in FIG. 3, the voltage of the internal power supply VDD0 drops each time the charging current IL1 is generated, and the voltage of the internal ground GND0 rises each time the discharge current IL2 is generated. Accordingly, it is obvious that, each time the charging current IL1 and the discharge current IL2 are generated, the power supply noise is superimposed on the internal power supply VDD0 or the internal ground GND0, which results in a fluctuation of the voltage.

Figure 4:
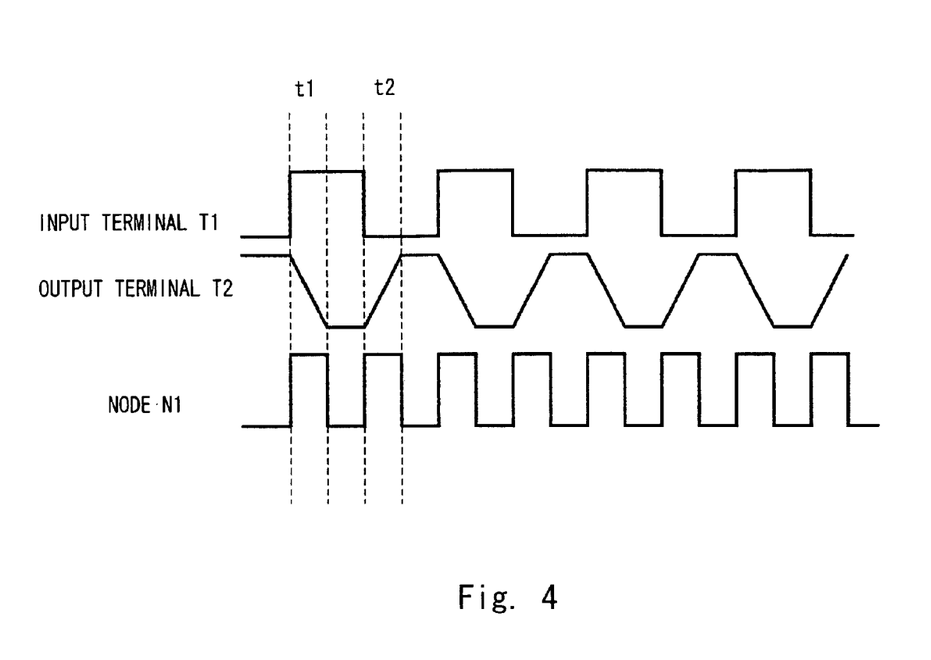
FIG. 4 shows voltage waveforms at nodes when a load is increased in the power-supply-noise cancelling circuit according to the first exemplary embodiment.
Figure 5:
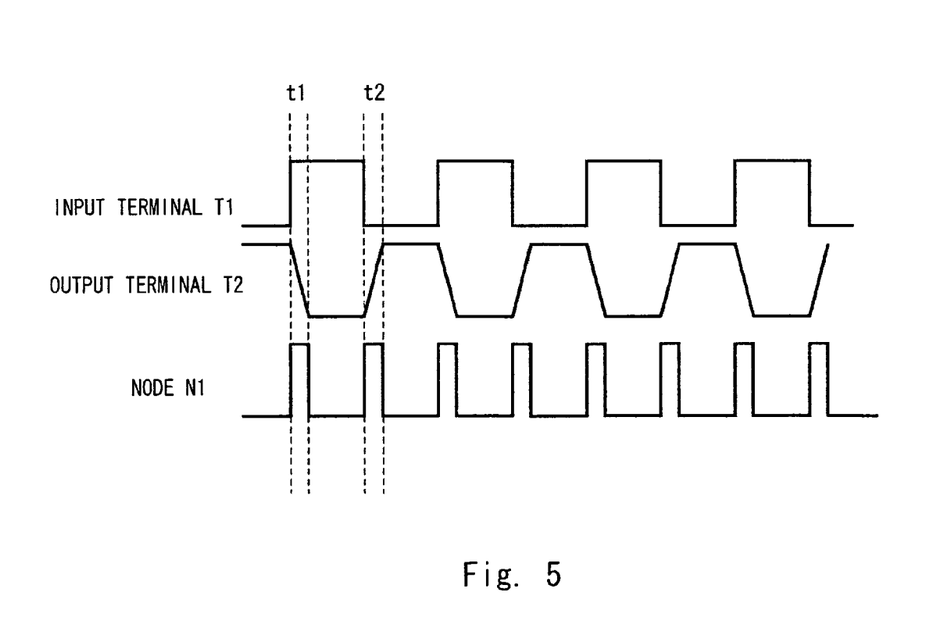
FIG. 5 shows voltage waveforms at nodes when a load is reduced in the power-supply-noise cancelling circuit according to the first exemplary embodiment.

Next, the noise cancellation performed by the noise cancelling circuit according to an exemplary embodiment of the present invention when the external load is varied are shown in FIG. 4 (when the load is large) and FIG. 5 (when the load is small).

In the case where a load capacitance larger than a predetermined load capacitance is connected to the output terminal T2, when an input signal that changes from the low level to the high level is input to the input terminal T1, the output circuit 1 causes the discharge current IL2 to flow to the internal ground GND0 so as to set the potential at the output terminal T2 to the low level. In this case, the flow rate of the discharge current IL2 is limited and controlled by the current drive capability of the N-channel transistor MN1 constituting the output circuit 1. Thus, the gradient of the waveform of the potential at the output terminal T2 changing from the high level to the low level is gentle, and the period t1 increases. As the period t1 increases, the period in which the potential at the input terminal T1 and the potential at the output terminal T2 are settled to the high level and the low level, respectively, increases, and the period in which the gate circuit EXNOR outputs the high-level signal to the P-channel transistor MP4, that is, the period in which the transistor MP4 is turned off to thereby turn off the constant current I1 increases. Note that, also when the input signal that changes from the high level to the low level is input to the input terminal T1, the period t2 for turning off the constant current I1 increases. Accordingly, during the period in which the charging current IL1 or the discharge current IL2 flows, the constant current I1 can be turned off, and thus the power supply noise generated by the charging current IL1 and the discharge current IL2 can be cancelled.

On the contrary, in the case where a load capacitance smaller than the predetermined load capacitance is connected to the output terminal T2, when the input signal that changes from the low level to the high level is input to the input terminal T1, the output circuit 1 causes the discharge current IL2 to flow to the internal ground GND0 so as to set the potential at the output terminal T2 to the low level. In this case, the flow rate of the discharge current IL2 is limited and controlled by the current drive capability of the N-channel transistor MN1 constituting the output circuit 1. Thus, the gradient of the waveform of the potential at the output terminal T2 changing from the high level to the low level is steep, and the period t1 decreases. As the period t1 decreases, the period in which the potential at the input terminal T1 and the potential at the output terminal T2 are settled to the high level and the low level, respectively, decreases, and the period in which the gate circuit EXNOR outputs the high-level signal to the P-channel transistor MP4, that is, the period in which the transistor MP4 is turned off to thereby turn off the constant current I1 decreases. Note that, also when the input signal that changes from the high level to the low level is input to the input terminal T1, the period t2 in which the constant current I1 is turned off decreases. Accordingly, during the period in which the charging current IL1 or the discharge current IL2 flows, the constant current I1 can be turned off, and thus the power supply noise generated by the charging current IL1 and the discharge current IL2 can be cancelled.

As described above, even when the load capacitance is larger or smaller than a given value, the period for cancelling the power supply noise can be set in accordance with the load capacitance.

Figure 6:
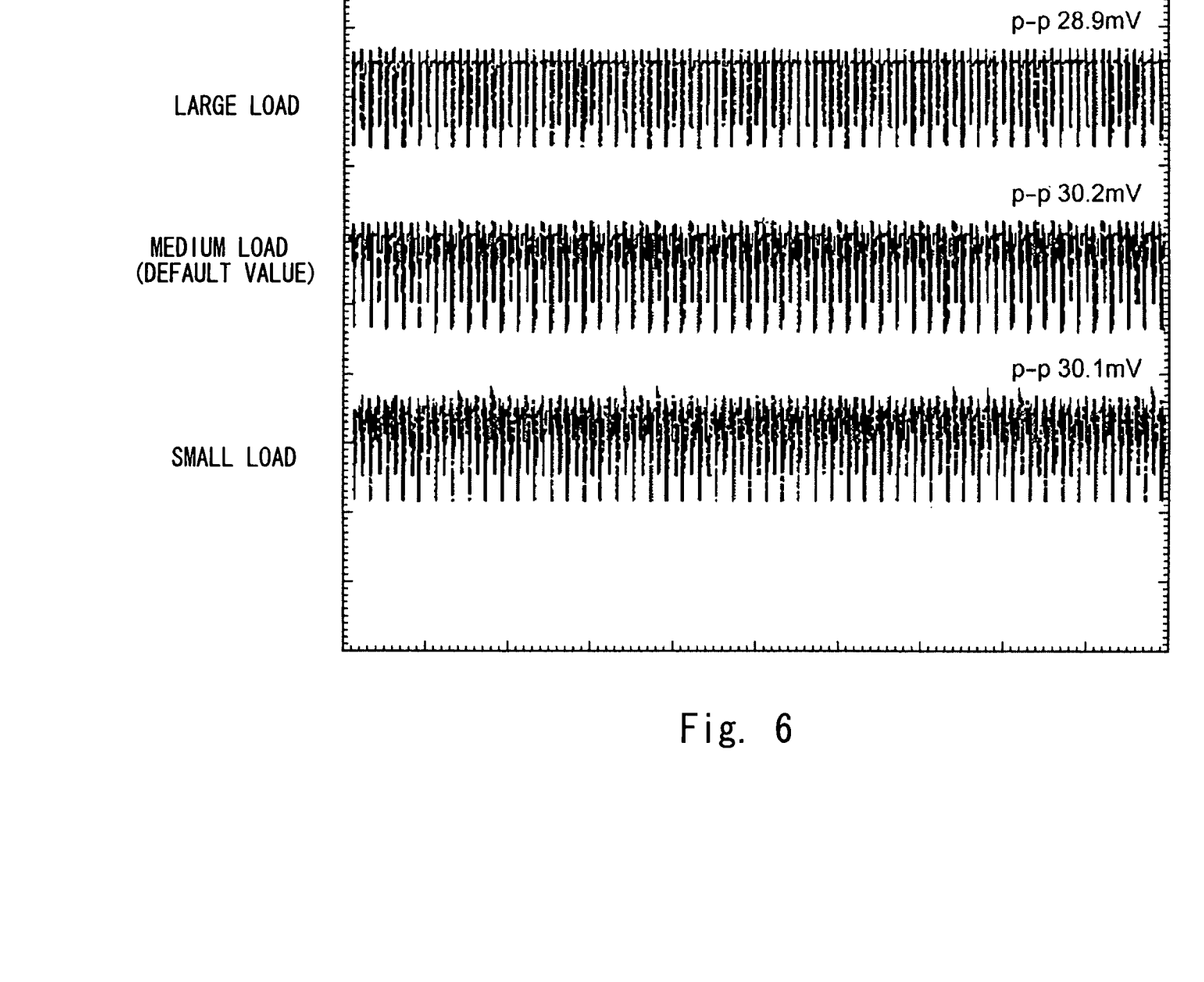
FIG. 6 shows waveforms of noise appearing at an output terminal when a load is varied in the power-supply-noise cancelling circuit according to the first exemplary embodiment.

Next, FIG. 6 shows waveforms of noise superimposed on the power supply when the power-supply-noise cancelling circuit according to an exemplary embodiment of the present invention is applied and the load is varied.

The upper portion of FIG. 6 shows a waveform of noise superimposed on the power supply when a load larger than a set load (about 20% larger in this embodiment) is used. The middle portion of FIG. 6 shows a waveform of noise superimposed on the power supply when a load equal to the set load is used. The lower portion of FIG. 6 shows a waveform of noise superimposed on the power supply when a load smaller than the set load (about 20% smaller in this embodiment) is used. As apparent from the noise waveforms, the noise-waveforms have an amplitude of about 30 mV under the three conditions, independently of the load fluctuation, and the effect of noise cancellation is maintained regardless of the magnitude of the load.

Next, a second exemplary embodiment of the present invention will be described with reference to FIG. 7. While the power-supply-noise cancelling circuit according to the first exemplary embodiment includes the P-ch transistors and the gate circuit EXNOR, a power-supply-noise cancelling circuit according to the second exemplary embodiment includes N-ch transistors and a gate circuit EXOR instead of the P-ch transistors and the gate circuit EXNOR. A power-supply-noise cancelling circuit 72 includes a gate circuit EXOR10, an N-channel transistor MN4, a constant current source I00, an N-channel transistor MN2, and an N-channel transistor MN3. The gate circuit EXOR10 has two inputs respectively connected to the input terminal T1 and the output terminal T2, and has an output connected to a node N10. The N-channel transistor MN4 has a gate connected to the node N10, and a drain connected to the internal power supply VDD0 provided in the LSI. The constant current source I00 has one end connected to the internal power supply VDD0. The N-channel transistor MN2 has a source and a drain which are connected between the other end of the constant current source I00 and the internal ground GND0, and has a gate connected to the other end of the constant current source I00. The N-channel transistor MN3 is connected to each of the internal ground GND0 and a source of the N-channel transistor MN4, and has a gate connected to the gate of the N-channel transistor MN2. The N-channel transistor MN2 and the N-channel transistor MN3 constitute a current mirror.

The second exemplary embodiment is different from the first exemplary embodiment in that a signal output to the node N10 is inverted, since the power-supply-noise cancelling circuit according to the second exemplary embodiment includes the N-ch transistors and the gate circuit EXOR. The operations thereof are described below.

Figure 7:
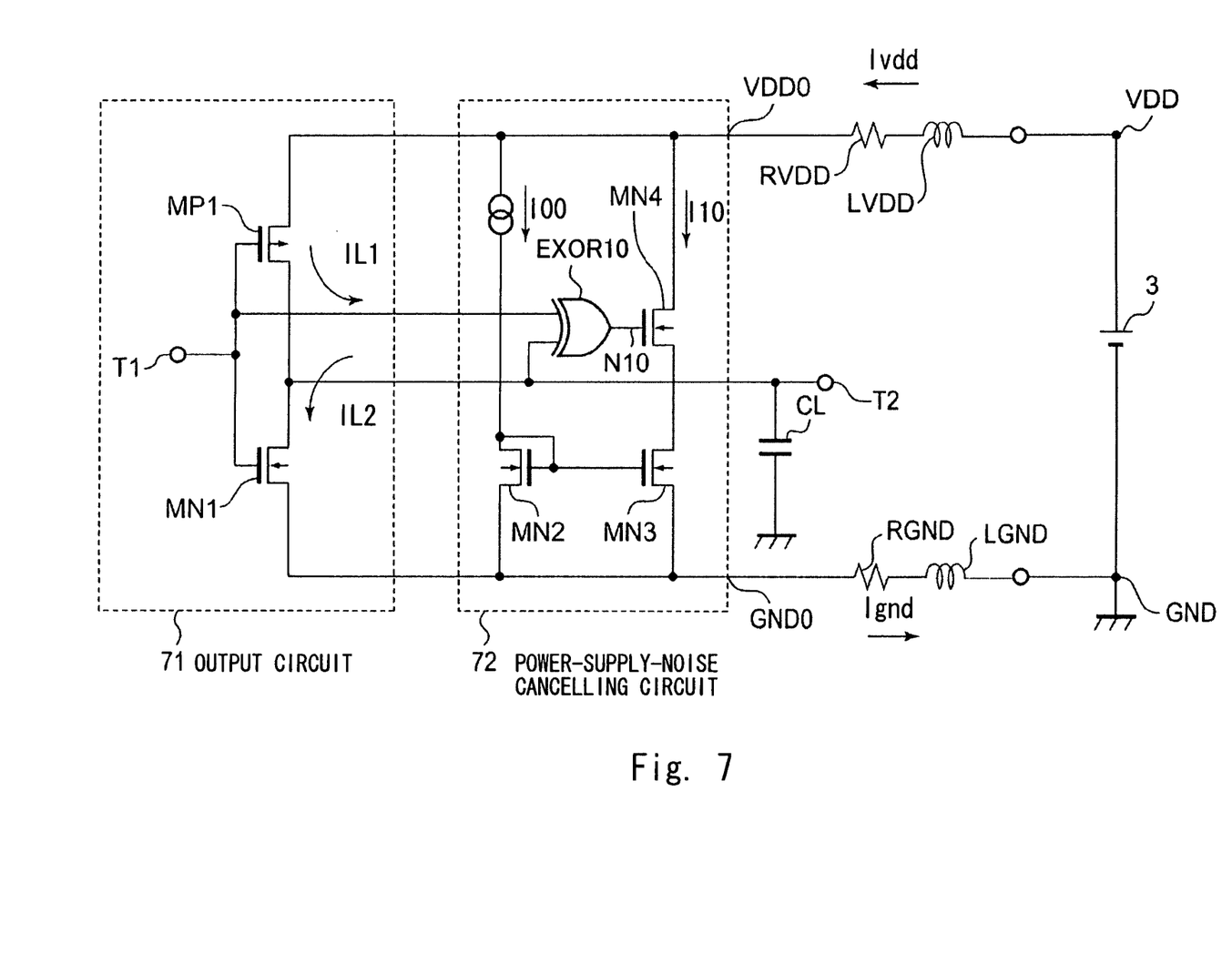
FIG. 7 is a circuit diagram including a power-supply-noise cancelling circuit according to a second exemplary embodiment of the present invention.

Referring to FIG. 7, when the charging current IL1 flows, the gate circuit EXOR10 obtains an exclusive OR between a signal at the input terminal T1 and a signal at the output terminal T2, and outputs a signal to the node N10 in the power-supply-noise cancelling circuit 72. The gate circuit EXOR10 outputs the low-level signal during the period in which the charging current IL1 flows to the load capacitance CL. Thus, the N-channel transistor MN4 is turned off, and a constant current I10 caused to flow through the power-supply-noise cancelling circuit 72 by the constant current source I00 and the N-channel transistors MN2 and MN3, which constitute a current mirror, is turned off.

Likewise, when the discharge current IL2 flows, the gate circuit EXOR10 obtains an exclusive OR between a signal at the input terminal T1 and a signal at the output terminal T2, and outputs a signal to the node N10 in the power-supply-noise cancelling circuit 72. The gate circuit EXOR10 outputs the low-level signal during the period in which the discharge current IL2 flows from the load capacitance CL. Thus, the N-channel transistor MN4 is turned off, and the constant current I10 caused to flow through the power-supply-noise cancelling circuit 72 by the constant current source I100 and the transistor MN2 and the transistor MN3, which constitute a current mirror, is turned off. Note that the other operations are similar to those of the first exemplary embodiment, and the description thereof is omitted.

Next, a third exemplary embodiment of the present invention will be described with reference to FIG. 8. While the output circuit 1 according to the first exemplary embodiment includes an inverter, an output circuit according to the third exemplary embodiment includes a buffer. An output circuit 81 includes a P-channel transistor MP1, the N-channel transistor MN1, a P-channel transistor MP100, and an N-channel transistor MN100. The P-channel transistor MP1 has a gate connected to the input terminal T1, and a source connected to the internal power supply VDD0. The N-channel transistor MN1 has a gate connected to the input terminal T1, a source connected to the internal ground GND0, and a drain connected to a drain of the P-channel transistor MP1. The P-channel transistor MP100 has a source and a drain which are connected between the internal power supply VDD0 and the output terminal T2, and has a gate connected to each of the drain of the P-channel transistor MP1 and the drain of the N-channel transistor MN1. The N-channel transistor MN100 has a source and a drain which are connected between the output terminal T2 and the internal ground GND0, and has a gate connected to each of the drain of the P-channel transistor MP1 and the drain of the N-channel transistor MN1.

A power-supply-noise cancelling circuit 82 has the same configuration as that according to the first exemplary embodiment, except that the gate circuit EXNOR that performs an exclusive NOR operation according to the first exemplary embodiment is replaced with a gate circuit EXOR100 that performs an exclusive OR operation.

Figure 8:
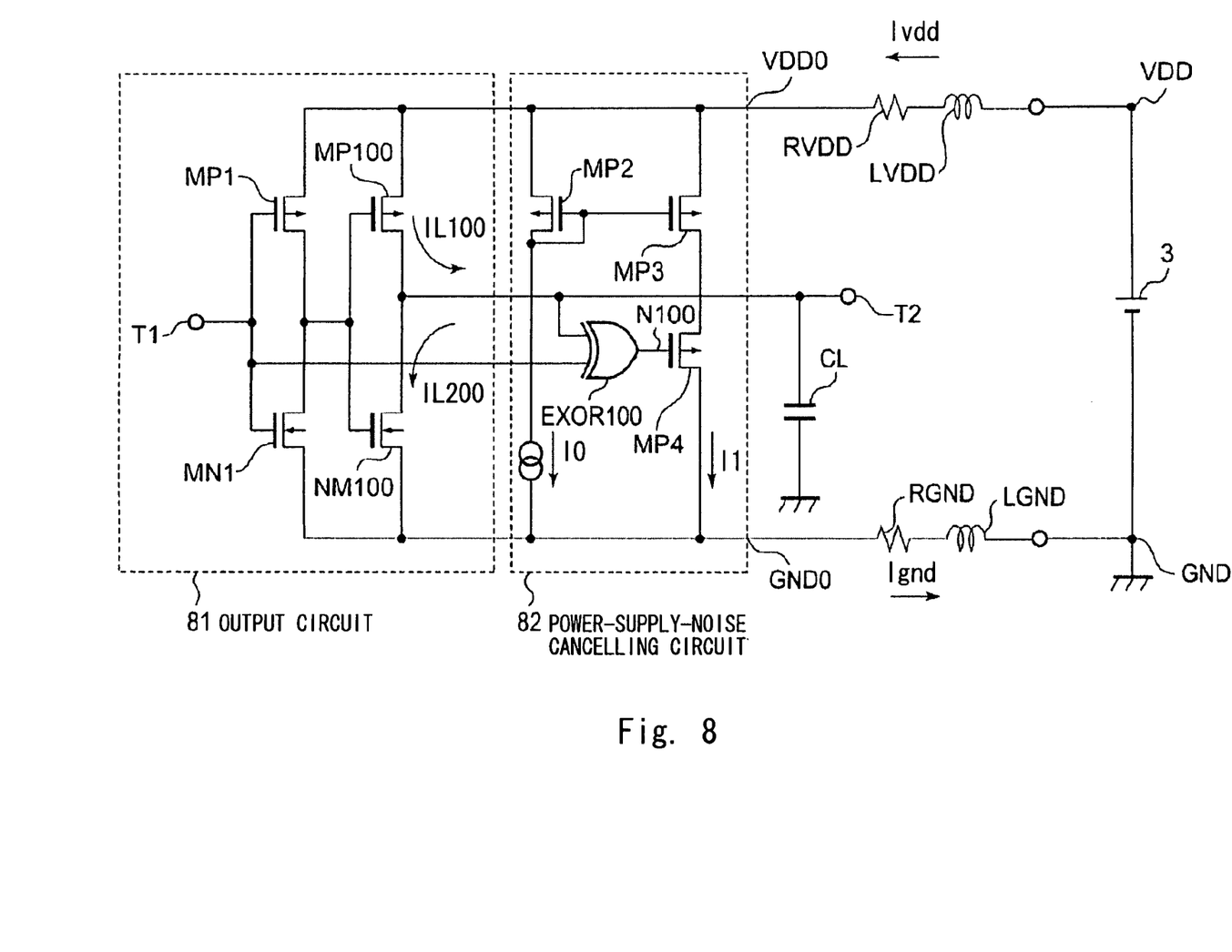
FIG. 8 is a circuit diagram including a power-supply-noise cancelling circuit according to a third exemplary embodiment of the present invention.

Referring to FIG. 8, when a charging current IL100 flows, the gate circuit EXOR100 obtains an exclusive OR between a signal at the input terminal T1 and a signal at the output terminal T2, and outputs a signal to a node N100 in the power-supply-noise cancelling circuit 82. During the period in which the charging current IL100 flows to the load capacitance CL, the gate circuit EXOR100 outputs the low-level signal to turn off the P-channel transistor MP4. Thus, the constant current I1 caused to flow through the power-supply-noise cancelling circuit 82 by the current source I0 and the P-channel transistors MP2 and MP3, which constitute a current mirror, is turned off.

Likewise, when a discharge current IL200 flows, the gate circuit EXOR100 obtains an exclusive OR between a signal at the input terminal T1 and a signal at the output terminal T2, and outputs a signal to the node N100. During the period in which the discharge current IL200 flows from the load capacitance CL, the gate circuit EXOR100 outputs the low-level signal to turn off the P-channel transistor MP4. Thus, the constant current I1 caused to flow through the power-supply-noise cancelling circuit 82 by the current source I0 and the transistor MP2 and the transistor MP3, which constitute a current mirror, is turned off. The other operations are similar to those of the first exemplary embodiment, and the description thereof is omitted.

As described above, according to the first to third exemplary embodiments, the power-supply-noise cancelling circuits operate according to the input signal input to the output circuit and the output signal output from the output circuit. Therefore, even when the external load is varied, it is possible to cancel the power supply noise.

While the power-supply-noise cancelling circuit according to the prior art requires four terminals as terminals for each of the internal power supply and the internal ground, the power-supply-noise cancelling circuit according to the first to third exemplary embodiments of the present invention can be implemented by using a single terminal for each of the internal power supply and the internal ground, thereby providing an effect to reduce in the number of terminals.

The power-supply-noise cancelling circuit in which the constant current I1 is used with the P-channel transistor MP3, which constitutes a current mirror, being used as a current load has been described above by way of example. Alternatively, a resistor element may be provided as the current load instead of the transistor MP3, without providing the current mirror circuit.

Each of the above exemplary embodiments is applied to an inside (chip) of an LSI, and the case where the external load (provided outside the chip) is driven has been described above. Alternatively, the present invention can also be applied to a case where a load is driven by a macro included in an LSI.

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicant's intent is to encompass equivalents of all claim elements, even if amended later during prosecution.

What is claimed is:

1. A semiconductor integrated circuit comprising:
   a macro connected between a first power supply line and a second power supply line to drive a load; and
   a power-supply-noise cancelling circuit connected between an input and an output of the macro to generate a current for canceling one of a current flowing from the first power supply line to the output of the macro and a current flowing from the output of the macro to the second power supply line, on the basis of a potential difference between the input and the output of the macro,
   wherein the macro and the power-supply-noise cancelling circuit are mounted in a same chip.

2. The semiconductor integrated circuit according to claim 1, wherein
   the power-supply-noise cancelling circuit comprises a load element and a switching element, the load element and the switching element being connected in series between the first power supply line and the second power supply line, and
   wherein conduction and non-conduction of the switching element is controlled based on the potential difference between the input and the output of the macro.

3. The semiconductor integrated circuit according to claim 2, wherein the power-supply-noise cancelling circuit comprises:
   a first transistor serving as the load element connected between the first power supply line and a first node, and including a control terminal connected to a second node;
   a second transistor connected between the first power supply line and the second node, and including a control terminal connected to the second node;
   a current source connected between the second node and the second power supply line;
   a third transistor serving as the switching element connected between the first node and the second power supply line; and
   a control circuit controlling conduction and non-conduction of the third transistor on the basis of the potential difference between the input and the output of the macro.

4. The semiconductor integrated circuit according to claim 3, wherein the macro comprises an inverter circuit.

5. The semiconductor integrated circuit according to claim 4, wherein
   the third transistor comprises a P-channel transistor, and
   the control circuit comprises a gate circuit outputting an exclusive NOR, has an input connected to each of the input and the output of the macro, and has an output connected to a control terminal of the third transistor.

6. The semiconductor integrated circuit according to claim 4, wherein
   the third transistor comprises an N channel transistor, and
   the control circuit comprises a gate circuit outputting an exclusive OR, has an input connected to each of the input and the output of the macro, and has an output connected to a control terminal of the third transistor.

7. The semiconductor integrated circuit according to claim 3, wherein the macro comprises a buffer circuit.

8. The semiconductor integrated circuit according to claim 7, wherein
the third transistor comprises a P-channel transistor, and
the control circuit comprises a gate circuit outputting an exclusive OR, has an input connected to each of the input and the output of the macro, and has an output connected to a control terminal of the third transistor.

9. The semiconductor integrated circuit according to claim 1, wherein the power-supply-noise cancelling circuit determines a period for cancellation according to the potential difference between the input and the output of the macro.

10. The semiconductor integrated circuit according to claim 1, wherein the power-supply-noise cancellation circuit determines a period for cancellation corresponding to a variation in current value due to a variation of the load applied.

11. The semiconductor integrated circuit according to claim 1, wherein the power-supply-noise cancelling circuit includes a current load to cancel noise on the basis of the potential difference between the input and the output of the macro.

12. The semiconductor integrated circuit according to claim 1, wherein the power-supply-noise cancelling circuit comprises:
a switch connected between the first supply line and the second power supply line to connect a load element between the first supply line and the second power supply line; and a control circuit controlling conduction and non-conduction of the switch on a basis of the potential difference between the input and the output of the macro.

13. The semiconductor integrated circuit according to claim 1, wherein the power-supply-noise cancelling circuit switches a connection between a load element and the second power supply line on a basis of the potential difference between the input and the output of the macro.

14. The semiconductor integrated circuit according to claim 1, wherein the power-supply-noise cancelling circuit controls a second load between the first power supply line and the second power supply line based on the potential difference between the input and the output of the macro.

15. The semiconductor integrated circuit according to claim 1, wherein the power-supply-noise cancelling circuit comprises:
a first transistor serving as a load element connected between the first power supply line and a first node, and including a control terminal connected to a second node;
a second transistor connected between the first power supply line and the second node, and including a control terminal connected to the second node; and
a current source connected between the second node and the second power supply line; and
a third transistor switching a connection between the first node and the second power supply line on the basis of the potential difference between the input and the output of the macro.

16. The semiconductor integrated circuit according to claim 1, wherein the power-supply-noise cancelling circuit comprises a current source providing current to the second power supply line on the basis of the potential difference between the input and the output of the macro.

17. The semiconductor integrated circuit according to claim 1, wherein the second power supply line comprises an internal ground line.

18. The semiconductor integrated circuit according to claim 1, wherein the first power supply line comprises an internal power supply, and
wherein the power-supply-noise canceling circuit is implemented with a minimum of a single terminal for each of the first and second power supply lines.

19. The semiconductor integrated circuit according to claim 1, wherein a timing of the current to cancel the noise is dynamically changed by the power-supply-noise cancelling circuit according to a determined operation timing.

20. The semiconductor integrated circuit according to claim 1, wherein a current source is connected between the second node and the second power supply line.

21. The semiconductor integrated circuit according to claim 1, wherein the power-supply-noise cancelling circuit comprises:
a first transistor serving as a load element connected between the first power supply line and a first node, and including a control terminal connected to a second node;
a second transistor connected between the first power supply line and the second node, and including a control terminal connected to the second node;
a third transistor serving as a switching element connected between the first node and the second power supply line; and
a control circuit controlling conduction and non-conduction of the third transistor on the basis of the potential difference between the input and the output of the macro.

22. The semiconductor integrated circuit according to claim 1, wherein the power-supply-noise canceling circuit is implemented with a minimum of a single terminal for each of the first and second power supply lines.

23. A semiconductor integrated circuit comprising:
a macro connected between an internal power supply line and an internal ground line to drive a load; and
a power-supply-noise cancelling circuit connected between an input and an output of the macro to generate a current to control a current flowing from the internal power supply line to the output of the macro and a current flowing from the output of the macro to the internal ground line, on a basis of a potential difference between the input and the output of the macro, wherein
the power supply-noise cancelling circuit comprises a load element and a current source being controlled based on the potential difference between the input and the output of the macro, and
the macro and the power-supply-noise cancelling circuit are mounted in a same chip.

* * * * *